United States Patent
Wang

(10) Patent No.: US 9,076,911 B2
(45) Date of Patent: Jul. 7, 2015

(54) SOLAR CELL MODULE AND MANUFACTURING METHOD THEREOF

(71) Applicant: WIN WIN PRECISION TECHNOLOGY CO., LTD., Sinfong Township, Hsinchu County (TW)

(72) Inventor: Cheng-Lien Wang, Sinfong Township, Hsinchu County (TW)

(73) Assignee: Win Win Precision Technology Co., Ltd. (TW)

( * ) Notice: Subject to any disclaimer, the term of this patent is extended or adjusted under 35 U.S.C. 154(b) by 49 days.

(21) Appl. No.: 13/843,874

(22) Filed: Mar. 15, 2013

(65) Prior Publication Data

US 2014/0083503 A1    Mar. 27, 2014

(30) Foreign Application Priority Data

Sep. 27, 2012 (TW) .............................. 101135571 A

(51) Int. Cl.
| | |
|---|---|
| H01L 31/052 | (2014.01) |
| H01L 31/048 | (2014.01) |
| H01L 31/0216 | (2014.01) |

(52) U.S. Cl.
CPC ............ *H01L 31/052* (2013.01); *H01L 31/048* (2013.01); *Y02E 10/50* (2013.01); *H01L 31/02167* (2013.01)

(58) Field of Classification Search
USPC ......................................... 136/259
See application file for complete search history.

(56) References Cited

U.S. PATENT DOCUMENTS

| | | | | |
|---|---|---|---|---|
| 5,951,786 | A   * | 9/1999  | Gee et al. ........ | 136/256 |
| 2004/0103937 | A1 * | 6/2004  | Bilyalov et al. ........ | 136/255 |
| 2005/0189015 | A1 * | 9/2005  | Rohatgi et al. ........ | 136/261 |
| 2007/0295399 | A1 * | 12/2007 | Carlson ........ | 136/261 |

* cited by examiner

*Primary Examiner* — Shannon Gardner
(74) *Attorney, Agent, or Firm* — Merchant & Gould P.C.

(57) ABSTRACT

A solar cell module and a manufacturing method thereof are provided. A solar cell device including a light receiving surface and a non-light-receiving surface opposite to the light-receiving surface is provided. A first protective film and a cover plate are formed on the light-receiving surface, wherein the first protective film is located between the solar cell device and the cover plate. A thermal radiation material layer is screen printed and a second protective is formed on the non-light-receiving surface. A backplane is formed on the non-light-receiving surface, wherein the second protective film is located between the solar cell device and the backplane.

6 Claims, 4 Drawing Sheets

SOLAR CELL MODULE AND MANUFACTURING METHOD THEREOF

RELATED APPLICATIONS

This application claims priority to Taiwanese Application Serial Number 101135571, filed Sep. 27, 2012, which is herein incorporated by reference.

BACKGROUND

1. Field of Invention

The present invention relates to a solar cell module and a manufacturing method thereof.

2. Description of Related Art

In the case of petrochemical energy shortages as well as the increasing demand for energy, the development of renewable energy become one of the very important issues. Renewable energy refers to natural sustainable and non-polluting energy sources, such as solar energy, wind energy, water energy, tidal energy or biomass energy. Solar energy research and development in recent years is also important and popular.

The solar cell is a photovoltaic device, which converts light energy into electricity. The solar cells include single-crystal silicon, polycrystalline silicon, amorphous silicon, thin-film and dye solar cells. Single-crystal silicon solar cells, for example, employ a P-type semiconductor as a substrate, and doping pentavalent atoms (e.g., a phosphorus atom) into in the P-type substrate to form a P-N junction. It is well known that the P-N junction has a built-in potential, which generates a depletion region at the junction. When the sunlight emits the P-N junction of the P-type substrate, the photon energy would excite the electronic ion within the semiconductor and generate electron-hole pairs. The electron and hole are subject to the influence of the built-in potential, that is, the hole will be moved towards the direction of the electric field while electrons move in the opposite direction. At this time, when a wire is used to interconnect between the load and the solar cell electrodes, there will be current flowing through the load. This is the operation principle of the solar cell power generation, also known as the photovoltaic effect.

Because the solar cell does not produce pollution and not consume the Earth resources, the solar cells increasingly draw attentions and concerns of audiences, and make all the manufacturers invest in the solar cell market. For the forgoing reasons, there is a need for enhancing the competitiveness of their products as well as research and development on the solar cells with better power efficiency.

SUMMARY

It is therefore an objective of the present invention to provide a solar cell module of better power generation efficiency.

In accordance with the foregoing and other objectives of the present invention, a method for manufacturing solar cell module includes a step of providing a solar cell device which includes a light-receiving surface and a non-light-receiving surface opposite to the light-receiving surface; a step of forming a first protective film and a cover plate on the light-receiving surface, wherein the first protective film is located between the solar cell device and the cover plate; a step of screen printing a thermal radiation material layer and forming a second protective film on the non-light-receiving surface; and a step of forming a backplane on the non-light-receiving surface, wherein the second protective film is located between the solar cell device and the backplane.

According to another embodiment disclosed herein, the solar cell device includes a first electrode layer, a photoelectric conversion layer, a second electrode layer and multiple metal electrodes, wherein the first and second electrode layers are disposed on two opposite first surface and second surface of the photoelectric conversion layer respectively, the metal electrodes are disposed on the second surface and electrically connected with the second electrode layer, the thermal radiation material layer is disposed on the second surface and partially covered over the second electrode layer, but the metal electrodes are exposed.

According to another embodiment disclosed herein, the photoelectric conversion layer includes a P-N junction, a P-I-N junction or any combinations thereof.

According to another embodiment disclosed herein, the thermal radiation material layer has a thickness ranging from about 20 microns to about 50 microns.

According to another embodiment disclosed herein, the thermal radiation material layer includes silicon carbide powders.

In accordance with the foregoing and other objectives of the present invention, a solar cell module includes a solar cell device, a first protective film, a cover plate, a thermal radiation material layer, and a backplane. The solar cell device includes a first electrode layer, a photoelectric conversion layer, a second electrode layer and multiple metal electrodes, wherein the first and second electrode layers are located on two opposite first surface and second surface of the photoelectric conversion layer respectively, the metal electrodes are located on the second surface and electrically connected with the second electrode layer. The first protective film is located between the solar cell device and the cover plate. The thermal radiation material layer is located on the second surface and partially covered over the second electrode layer, but exposes the metal electrodes. The thermal radiation material layer is located between the solar cell device and the backplane.

According to another embodiment disclosed herein, the solar cell module further includes a second protective film located between the thermal radiation material layer and the backplane.

According to another embodiment disclosed herein, the photoelectric conversion layer includes a P-N junction, a P-I-N junction or any combinations thereof.

According to another embodiment disclosed herein, the thermal radiation material layer has a thickness ranging from about 20 microns to about 50 microns.

According to another embodiment disclosed herein, the thermal radiation material layer includes silicon carbide powders.

Thus, the solar cell module herein is equipped with the thermal radiation material layer sandwiched between the solar cell device and the backplane to effectively dissipate heat out of the module by maximizing its thermal radiation rate. Therefore, a power generation efficiency of the solar cell module can be enhanced due to a lower operation temperature. In addition, the thermal radiation material layer is partially covered over the electrode layer to at least expose the metal electrodes so as to reduce the broken piece and enhance the yield of the solar cell module. The thermal radiation material layer is formed by screen printing, which makes the thermal radiation material layer firmly attached to the solar cell device, thereby reducing the possibility of the thermal radiation material layer being peeled off from the solar cell device.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
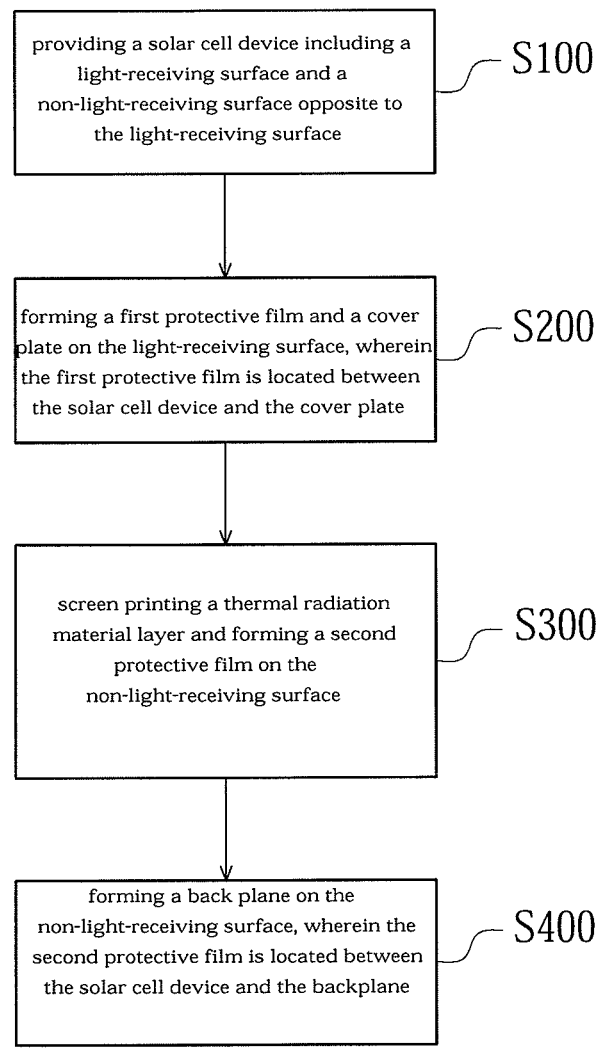
FIG. 1 illustrates a flowchart for manufacturing a solar cell module according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 illustrates a flowchart for manufacturing a solar cell module according to one preferred embodiment of this invention. In step S100, a solar cell device, which includes a light-receiving surface and a non-light-receiving surface opposite to the light-receiving surface, is provided. Then, in step S200, a first protective film and a cover plate are formed on the light-receiving surface of the solar cell device. The first protective film is located between the solar cell device and the cover plate. In step S300, a thermal radiation material layer is screen printed and a second protective film is formed on the non-light-receiving surface of the solar cell device. Finally, in step S400, a backplane is formed on the non-light-receiving surface of the solar cell device, and the second protective film is located between the solar cell device and the backplane.

It is noted that the solar cell module can be manufactured by sequentially executing the steps in the order of S100, S200, S300 and S400, or in the order of S100, S300, S200 and S400, or in the order of S100, S300, S400 and S200.

FIGS. 2A-2D illustrate a series of cross-sectional views for manufacturing a solar cell module according to one preferred embodiment of this invention.

Figure 2A:
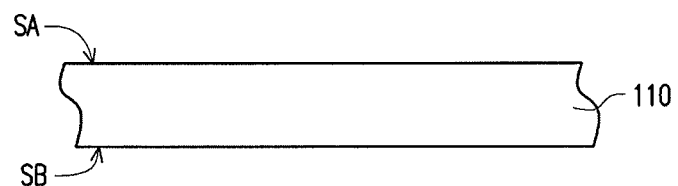
FIGS. 2A-2D illustrate a series of cross-sectional views for manufacturing a solar cell module according to one preferred embodiment of this invention.

Referring to FIG. 2A, a solar cell device 110 is provided. The solar cell device 110 can be silicon solar cells, compound semiconductor solar cells, dye solar cells or thin film solar cells. The solar cell device 110 is equipped with a light-receiving surface SA and a non-light-receiving surface SB. The "light-receiving surface" SA is the surface of the solar cell device, which faces the sun, and the "non-light-receiving surface" SB is the surface opposite to the light-receiving surface.

Figure 2B:
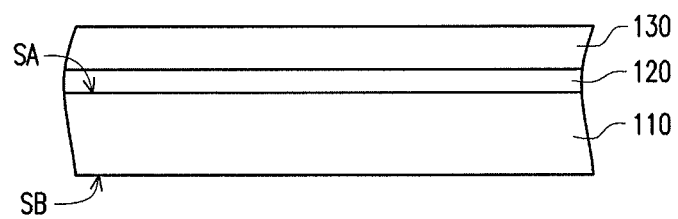

Referring to FIG. 2B, a first protective film 120 and a cover plate 130 are formed on the light-receiving surface SA of the solar cell device 110. The first protective film 120 is located between the solar cell device 110 and the cover plate 130. The first protective film 120 can be ethylene vinyl acetate (EVA), poly vinyl butyral (PVB), polyolefin, polyurethane, silicone or other transparent polymer insulation adhesive materials. The cover plate 130 is used to enhance the reliability of the solar cell module. The cover plate 130 can be a substrate of high transmittance, e.g., a low-iron glass substrate.

Figure 2C:
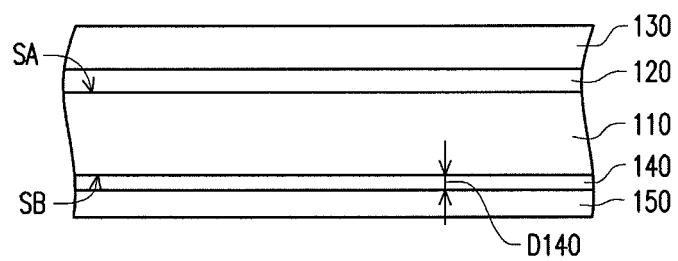
Figure 2D:
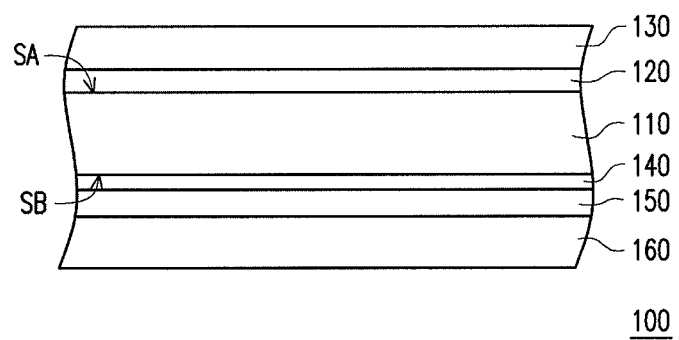

Referring to FIG. 2C, a thermal radiation material layer 140 and a second protective film 150 are formed on the non-light-receiving surface SB of the solar cell device 110. In this embodiment, the thermal radiation material layer 140 is located between the solar cell device 110 and the second protective film 150. The second protective film 150 can be made by the same materials as the first protective film 120, i.e., ethylene vinyl acetate (EVA), poly vinyl butyral (PVB), polyolefin, polyurethane, silicone or other transparent polymer insulation adhesive materials. The first protective film 120 and the second protective film 150 are used to seal the solar cell device 110 and the thermal radiation material layer 140 between the cover plate 130 and the backplane (as illustrated in FIG. 2D) to protect them from external impacts. The thermal radiation material layer 140 is preferably manufactured on the non-light-receiving surface SB of the solar cell device 110 by screen printing process. The screen printing is widely used to form the busbar or its fingers on the solar cell device, and thus conveniently used to form the thermal radiation material layer 140.

By using screen printing to form the thermal radiation material layer 140, the thermal radiation material layer 140 can be firmly attached to the solar cell device 110, thereby reducing the possibility of the thermal radiation material layer 140 being peeled off from the solar cell device 110 as well as preventing the bubbles or other matters from penetrating into the solar cell device 110. That is, by using screen printing to form the thermal radiation material layer 140, the yield of the solar cell module can be further enhanced.

In addition, by using screen printing to form the thermal radiation material layer 140, the thermal radiation material layer 140 can be precisely formed on the non-light-receiving surface SB of the solar cell device 110 according to actual demands, instead of fully covered over the non-light-receiving surface SB of the solar cell device 110, thereby saving actual thermal radiation material usage.

A conventional solar cell module without a thermal radiation material layer employs its protective film to dissipate heat out of the module. However, most protective films are equipped with lower thermal conductivity rate and lower thermal radiation rate so that the solar cell module cannot effectively dissipate the generated heat. Because the power generation efficiency of the solar cell module is reduced as the temperature increases, the power generation efficiency of the conventional solar cell module cannot be effectively enhanced due to its lower heat dissipation rate.

In this embodiment, the thermal radiation material layer 140 should be at least 0.8 and includes silicon carbide powders. The silicon carbide powders are preferably of nanometer-scale size. In addition, the thermal radiation material layer 140 further includes resin adhesive to be mixed with silicon carbide powders. A person skilled in the art can adjust the mixing ratio of the resin adhesive and silicon carbide powders according to actual demands.

It is noted that the thermal radiation material layer 140 is equipped with not only higher thermal radiation rate (also referred as thermal emissivity) but also higher thermal conductivity rate. Therefore, when the thermal radiation material layer 140 is sandwiched between the solar cell device 110 and the second protective film 150, the heat can be effectively dissipated out of the module via the thermal radiation and thermal conductivity so as to maintain the solar cell device 110 at lower operation temperature. According to the actual experiment results, the solar cell device 110 with the thermal radiation material layer 140 attached is operated at about 10° C. (which benefits the power generation efficiency up to 4%) lower than the solar cell device 110 without the thermal radiation material layer 140.

It is also noted that the thermal conductivity is reduced with the increase of the thickness D140 of thermal radiation material layer 140. That is, the thermal conductivity is inversely proportional to the thickness D140 of the thermal radiation material layer 140. In this embodiment, the thermal radiation material layer 140 has a preferred thickness D140 ranging from about 20 microns to about 50 microns.

Furthermore, the thermal radiation material layer 140 should be positioned properly to maximize its performance. Preferably, the thermal radiation material layer 140 is sandwiched between the solar cell device 110 and the second protective film 150, and in physical contact with the solar cell device 110 to maximize its performance.

Referring to FIG. 2D, a backplane 160 is formed over the second protective film 150, wherein the second protective film 150 is located between the solar cell device 110 and the backplane 160. In this embodiment, the second protective film 150 is located between the thermal radiation material layer 140 and the backplane 160. The backplane 160 can be made from glass or polycarbonate. The backplane 160 and the cover plate 130 both can be low-iron glass substrate or reinforced glass substrate. After assembling the backplane 160 to the module, the solar cell module 100 is almost done.

Figure 3A:
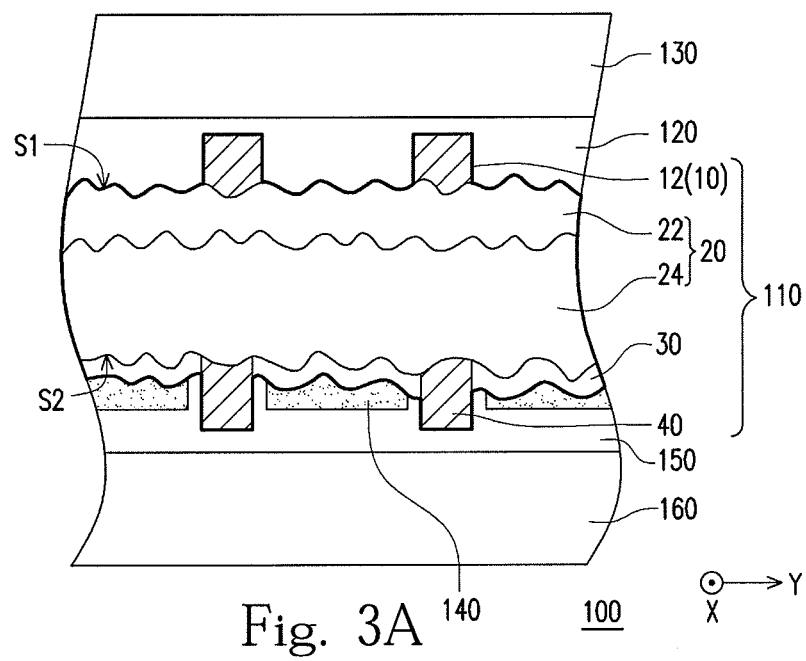
FIG. 3A illustrates a further detailed cross-sectional view of the solar cell module in FIG. 2D.
Figure 3B:
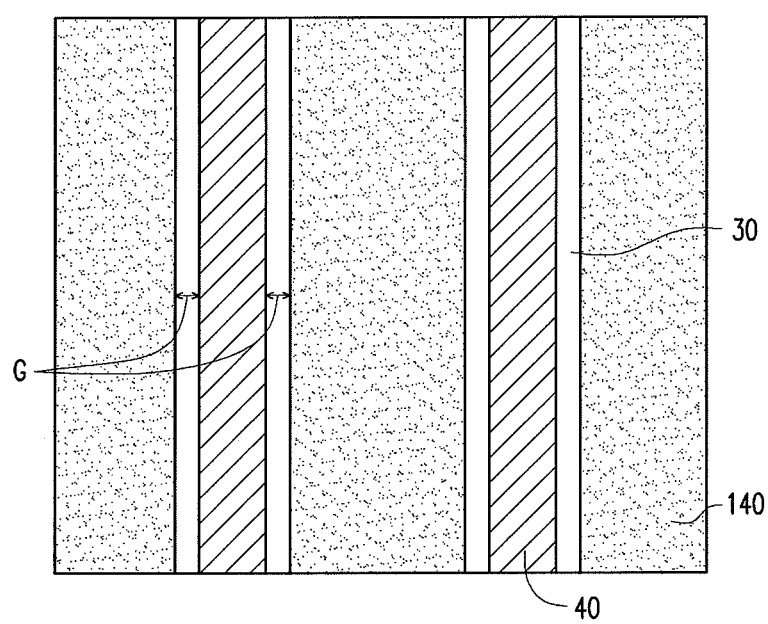
FIG. 3B illustrates a bottom view of the solar cell module in FIG. 3A.

FIG. 3A illustrates a further detailed cross-sectional view of the solar cell module in FIG. 2D, and FIG. 3B illustrates a bottom view of the solar cell module in FIG. 3A with the backplane 160 removed.

Referring to FIG. 3A, the solar cell device 110 includes a first electrode layer 10, a photoelectric conversion layer 20, a second electrode layer 30 and multiple metal electrodes 40. The first and second electrode layers (10, 20) are located on two opposite first surface S1 and second surface S2 of the photoelectric conversion layer 20 respectively. In this embodiment, the photoelectric conversion layer 20 can be a P-N junction consisting of stacked p-type doped layer 22 and N-type doped layer 24, but not being limited to. In other embodiment, the photoelectric conversion layer 20 can be a P-I-N junction consisting of stacked p-type doped layer, intrinsic layer and N-type doped layer. In other embodiment, the photoelectric conversion layer 20 can also be any combination of P-N junction and P-I-N junction.

The first electrode layer 10, the second electrode layer 30 and multiple metal electrodes 40 can be manufactured by screen-printing an aluminum glue or silver-aluminum glue, but not being limited to those glues or screen printing.

Moreover, the first electrode layer 10 can be formed on the light-receiving surface SA of the solar cell device 110 (referring also to FIG. 2D). In order to prevent the first electrode layer 10 from masking the incident light, the first electrode layer 10 can be designed with a predetermined pattern, e.g., a busbar 12 along the X-axis and its fingers (not illustrated in drawings) along the Y-axis, but not being limited to the mentioned pattern.

The second electrode layer 30 can be formed on the light-receiving surface SB of the solar cell device 110 (referring also to FIG. 2D). The second electrode layer 30 is often referred as back surface field (BSF), which is used to increase carrier collection and recycle unabsorbed photons. In addition, the multiple metal electrodes 40 are formed on the second surface S2 of the photoelectric conversion layer 20, and are electrically connected with the second electrode layer 30 so as to collect the currents from the second electrode layer 30.

The thermal radiation material layer 140 is formed on the second surface S2 of the photoelectric conversion layer 20 and partially covered over the second electrode layer 30 so as to at least expose the multiple metal electrodes 40.

Referring to FIGS. 3A and 3B again, multiple gaps G should be formed between the thermal radiation material layer 140 and the multiple metal electrodes 40 when the screen printing is performed. Therefore, the subsequent soldering process can be executed to interconnect with multiple solar cells so as to reduce the broken piece and enhance the yield of the solar cell module 100. In addition, the gaps G also provide the screen printing margins between the thermal radiation material layer 140 and the multiple metal electrodes 40.

According to the above-discussed embodiments, the solar cell module herein is equipped with a thermal radiation material layer sandwiched between the solar cell device and its backplane to effectively dissipate heat out of the module by maximizing its thermal radiation. Therefore, a power generation efficiency of the solar cell module can be enhanced due to a lower operation temperature. In addition, the thermal radiation material layer is partially covered over the electrode layer to at least expose the metal electrodes so as to reduce the broken piece and enhance the yield of the solar cell module. The thermal radiation material layer is formed by screen printing, which makes the thermal radiation material layer firmly attached to the solar cell device, thereby reducing the possibility of the thermal radiation material layer being peeled off from the solar cell device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing solar cell module comprising:
    providing a solar cell device which includes a first electrode layer, a photoelectric conversion layer, a second electrode layer and multiple metal electrodes, wherein the first and second electrode layers are disposed on two opposite first surface and second surface of the photoelectric conversion layer respectively, the metal electrodes are disposed on the second surface and electrically connected with the second electrode layer, the first surface is a light-receiving surface, and the second surface is a non-light-receiving surface opposite to the light-receiving surface;
    forming a first protective film and a cover plate on the light-receiving surface, wherein the first protective film is located between the solar cell device and the cover plate;
    screen printing a thermal radiation material layer and forming a second protective film on the non-light-receiving surface, the thermal radiation material layer is disposed on the second surface and partially covered over the second electrode layer, but the metal electrodes are exposed, wherein the thermal radiation material layer comprises silicon carbide powders, and the thermal radiation material layer is located between the second electrode layer and the second protective film; and forming a backplane on the non-light-receiving surface, wherein the second protective film is located between the solar cell device and the backplane.

2. The method of claim 1, wherein the photoelectric conversion layer comprises a P-N junction, a P-I-N junction or any combinations thereof.

3. The method of claim 1, wherein the thermal radiation material layer has a thickness ranging from about 20 microns to about 50 microns.

4. A solar cell module comprising:

a solar cell device comprises a first electrode layer, a photoelectric conversion layer, a second electrode layer and multiple metal electrodes, wherein the first and second electrode layers are disposed on two opposite first surface and second surface of the photoelectric conversion layer respectively, the metal electrodes are disposed on the second surface and electrically connected with the second electrode layer, wherein the first surface is a light-receiving surface, and the second surface is a non-light-receiving surface opposite to the light-receiving surface;

a first protective film disposed on the first surface and covered over the photoelectric conversion layer;

a cover plate, wherein the first protective film is located between the solar cell device and the cover plate;

a thermal radiation material layer and a second protective film disposed on the second surface, the thermal radiation material layer partially covered over the second electrode layer, but exposing the metal electrodes, wherein the thermal radiation material layer comprises silicon carbide powders, the thermal radiation material layer is located between the second electrode layer and the second protective film; and a backplane, wherein the thermal radiation material layer is located between the solar cell device and the backplane.

5. The solar cell module of claim 4, wherein the photoelectric conversion layer comprises a P-N junction, a P-I-N junction or any combinations thereof.

6. The solar cell module of claim 4, wherein the thermal radiation material layer has a thickness ranging from about 20 microns to about 50 microns.

* * * * *